(12) United States Patent  
Bae et al.

(10) Patent No.: US 8,937,002 B2  
(45) Date of Patent: Jan. 20, 2015

(54) NITRIDE ELECTRONIC DEVICE AND METHOD FOR MANUFACTURING THE SAME

(71) Applicant: Electronics and Telecommunications Research Institute, Daejeon (KR)

(72) Inventors: Sung Bum Bae, Daejeon (KR); Eun Soo Nam, Daejeon (KR); Jae Kyoung Mun, Daejeon (KR); Sung Bock Kim, Daejeon (KR); Hae Cheon Kim, Daejeon (KR); Chull Won Ju, Daejeon (KR); Sang Choon Ko, Daejeon (KR); Jong-Won Lim, Daejeon (KR); Ho Kyun Ahn, Daejeon (KR); Woo Jin Chang, Daejeon (KR); Young Rak Park, Daejeon (KR)

(73) Assignee: Electronics and Telecommunications Research Institute, DAEJEON (KR)

( * ) Notice: Subject to any disclaimer, the term of this patent is extended or adjusted under 35 U.S.C. 154(b) by 0 days.

(21) Appl. No.: 14/230,031

(22) Filed: Mar. 31, 2014

(65) Prior Publication Data

US 2014/0213045 A1    Jul. 31, 2014

Related U.S. Application Data

(62) Division of application No. 13/548,522, filed on Jul. 13, 2012, now Pat. No. 8,723,222.

(30) Foreign Application Priority Data

Jul. 19, 2011   (KR) .................. 10-2011-0071343  
Feb. 23, 2012   (KR) .................. 10-2012-0018591

(51) Int. Cl.  
*H01L 21/20*   (2006.01)  
*H01L 29/66*   (2006.01)  
(Continued)

(52) U.S. Cl.  
CPC ...... *H01L 29/66446* (2013.01); *H01L 21/8252* (2013.01); *H01L 27/0605* (2013.01);  
(Continued)

(58) Field of Classification Search  
CPC ............ H01L 21/0254; H01L 27/0605; H01L 21/8252  
USPC ................. 257/189, 194, E33.023, E29.246, 257/E29.089; 438/172, 478, 496  
See application file for complete search history.

(56) References Cited

U.S. PATENT DOCUMENTS 5,702,975 A *   12/1997   Yoon et al. ................. 438/167  
6,670,652 B2 *   12/2003   Song ........................... 257/194  
(Continued)

OTHER PUBLICATIONS

Bin Lu et al., "High-Performance Integrated Dual-Gate AlGaN/GaN Enhancement-Mode Transistor", IEEE Electron Device Letters, Sep. 2010, pp. 990-992, vol. 31, No. 9.

*Primary Examiner* — Jarrett Stark  
*Assistant Examiner* — Shahed Ahmed  
(74) *Attorney, Agent, or Firm* — Rabin & Berdo, P.C.

(57) ABSTRACT

The present disclosure relates to a nitride electronic device and a method for manufacturing the same, and particularly, to a nitride electronic device and a method for manufacturing the same that can implement various types of nitride integrated structures on the same substrate through a regrowth technology (epitaxially lateral over-growth: ELOG) of a semi-insulating gallium nitride (GaN) layer used in a III-nitride semiconductor electronic device including Group III elements such as gallium (Ga), aluminum (Al) and indium (In) and nitrogen.

2 Claims, 9 Drawing Sheets

(51) Int. Cl.
*H01L 21/8252* (2006.01)
*H01L 27/06* (2006.01)
*H01L 27/088* (2006.01)
*H01L 21/02* (2006.01)

(52) U.S. Cl.
CPC ......... *H01L27/0883* (2013.01); *H01L 21/0242* (2013.01); *H01L 21/02458* (2013.01); *H01L 21/0254* (2013.01); *H01L 21/02647* (2013.01)
USPC .......................................... 438/478; 257/189

(56) References Cited

U.S. PATENT DOCUMENTS

| | | | |
|---|---|---|---|
| 7,626,217 B2 | 12/2009 | Saxler | |
| 8,153,515 B2 * | 4/2012 | Saxler | 438/604 |
| 2006/0065929 A1 * | 3/2006 | Lee et al. | 257/347 |
| 2006/0226412 A1 | 10/2006 | Saxler et al. | |
| 2010/0109015 A1 | 5/2010 | Ueno | |
| 2010/0155781 A1 | 6/2010 | Suzuki et al. | |
| 2010/0213468 A1 * | 8/2010 | Lee et al. | 257/76 |
| 2011/0254014 A1 * | 10/2011 | Tsuchiya | 257/76 |

* cited by examiner

NITRIDE ELECTRONIC DEVICE AND METHOD FOR MANUFACTURING THE SAME

CROSS-REFERENCE TO RELATED APPLICATION

This application is a divisional of application Ser. No. 13/548,522, filed on Jul. 13, 2012. Further, this application claims the benefit of priority from Korean Patent Applications No. 10-2011-0071343, filed on Jul. 19, 2011 and No. 10-2012-0018591, filed on Feb. 23, 2012 with the Korean Intellectual Property Office. The disclosure of these prior U.S. and Korean applications are incorporated herein by reference.

TECHNICAL FIELD

The present disclosure relates to a nitride electronic device and a method for manufacturing the same, and particularly, to a nitride electronic device and a method for manufacturing the same that can implement can implement various types of nitride integrated structures on the same substrate through a regrowth technology (epitaxially lateral over-growth: ELOG) of a semi-insulating gallium nitride (GaN) layer used in a III-nitride semiconductor electronic device including Group III elements such as gallium (Ga), aluminum (Al) and indium (In) and nitrogen.

BACKGROUND

A gallium nitride (GaN)-based compound semiconductor is a direct transition type semiconductor and can control a wavelength from visible rays to ultraviolet rays. The gallium nitride-based compound semiconductor has high thermal and chemical stability and high electron mobility and saturated electron velocity. The gallium nitride-based compound semiconductor has excellent physical properties such as a large energy band gap as compared to known gallium arsenic (GaAs) and indium phosphorus (InP)-based compound semiconductors. On the basis of these properties, an application range of the gallium nitride-based compound semiconductor has been expanded to optical devices such as light emitting diodes (LEDs) of a visible ray region and laser diodes (LDs), and the next-generation wireless communication and satellite communication systems requiring high power and high frequency properties, which are fields having a limitation when using known compound semiconductors.

Performance of a gallium nitride-based electronic device is determined by an epitaxial structure, a process technology such as ohmic contact by a low resistance metal material and Schottky contact having high bather potential and a device design for determining a range of high frequency operation and current operation. Here, the epitaxial structure includes a barrier layer constituted by aluminum gallium nitride (AlGaN), indium aluminum nitride (InAlN), aluminum nitride (AlN) and the like, a channel layer used as an electron movement path and a semi-insulating layer for device isolation and reduction in leakage current.

However, when implementing integrated structures having various properties on a single substrate at the same time, there are many limitations in designing of the epitaxial structure, a device process and designing of a device, which is an obstacle to implementing a GaN-based electronic device.

Accordingly, in order to manufacture a GaN-based field effect transistor (FET), it is necessary to develop an epitaxial structure, a process technology and a device design technology that can manufacture various FET devices on a single substrate.

SUMMARY

The present disclosure has been made in an effort to provide an electronic device which has structures differently having channel layers and barrier layers through a regrowth technology using a GaN layer as a semi-insulating layer and regrowth, and has integrated structures with various properties, which are implemented on a single substrate using a unit process and a design technology, and a method for manufacturing the same.

An exemplary embodiment of the present disclosure provides a nitride electronic device, including: a first nitride integrated structure in which a low temperature buffer layer, a first semi-insulating nitride layer, a first channel layer and a first barrier layer are sequentially stacked on a substrate, and the first semi-insulating nitride layer is partially etched; and a second nitride integrated structure in which a second semi-insulating nitride layer, a second channel layer and a second barrier layer are sequentially stacked on a part where the first semi-insulating nitride layer is partially etched.

Another exemplary embodiment of the present disclosure provides a method for manufacturing a nitride electronic device, including: forming an epitaxial structure in which a low temperature buffer layer, a first semi-insulating nitride layer, a first channel layer and a first barrier layer are sequentially stacked on a substrate; stacking a first dielectric layer for forming a pattern on the first barrier layer and partially etching the first barrier layer, the first channel layer and the first semi-insulating nitride layer; regrowing a second semi-insulating nitride layer on the etched first semi-insulating nitride layer; sequentially stacking a second channel layer and a second barrier layer on the second semi-insulating nitride layer; stacking a second dielectric layer for forming a pattern on the second barrier layer and etching the second barrier layer, the second channel layer and the second semi-insulating nitride layer; and removing the first and second dielectric layers and stacking metal electrode layers on the first and second barrier layers.

According to the exemplary embodiments of the present disclosure, it is possible to obtain the following various effects by integrating various types of devices using a semi-insulating GaN layer that isolates devices and limits leakage current in an electronic device.

It is possible to implement a compound semiconductor integrated circuit in which various types of devices are simultaneously manufactured on a single substrate using a regrowth technology.

Since different kinds of epitaxial structures may be grown, it is possible to form, as necessary, various types of electronic devices such as integration of high frequency devices having different operating frequencies, integration of a depletion mode (normally-on) device and a enhancement mode (normally-off) device by adjusting a thickness of a barrier layer, integration of a high frequency device constituted by a channel layer and a barrier layer and a high current device constituted by a channel layer or a Schottky diode and the like.

As electronic devices are integrated vertically, a degree of integration of devices in the same area may be improved as compared to a known horizontal device arrangement, and when a semiconductor integration process is used, the surface planarization may be achieved in a horizontal direction, and devices may be integrated in a vertical direction.

DETAILED DESCRIPTION

Figure 1:
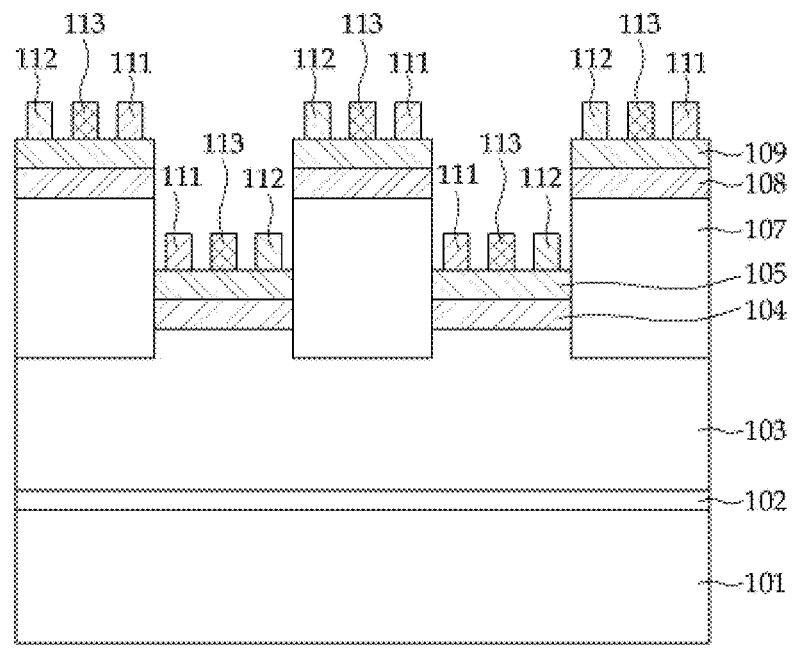
FIG. 1 is a cross-sectional view illustrating a structure of a GaN electronic device [KCI1] according to the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Hereinafter, exemplary embodiments of the present disclosure will be described in detail with reference to the accompanying drawings. The configuration of the present disclosure and operational effect thereof may be apparently understood through the following detailed description.

Prior to the detailed description of the present disclosure, it is noted that the same reference numerals refer to the same elements throughout the specification even though the same elements are shown in the other drawing, and known constitutions may not be described in detail if they make the gist of the present disclosure unclear.

FIG. 1 illustrates a cross-sectional view of a GaN electronic device according to an exemplary embodiment of the present disclosure.

As illustrated in FIG. 1, the GaN electronic device according to the exemplary embodiment of the present disclosure includes a sapphire substrate 101, a low temperature buffer layer 102, a first semi-insulating GaN layer 103, a first channel layer 104, a first barrier layer 105, a second semi-insulating GaN layer 107, a second channel layer 108, a second barrier layer 109, an ohmic contact layer-source electrode layer 111, an ohmic contact layer-drain electrode layer 112 and a Schottky contact layer-gate electrode layer 113.

According to the exemplary embodiment of the present disclosure, the second semi-insulating GaN layer 107 is used so as to ensure device isolation and reduction in leakage current of the GaN electronic device, and properties of electrical insulation and device isolation between first and second GaN integrated structures are implemented through a regrowth process of the second semi-insulating GaN layer 107, thereby manufacturing an electronic device capable of implementing the same kind of or different kinds of various devices together on the same substrate.

FIGS. 2 to 9 illustrate a manufacturing process of the GaN electronic device according to the exemplary embodiment of the present disclosure.

Describing the manufacturing process of the GaN electronic device, a basic epitaxial structure is first formed. The epitaxial structure is formed by sequentially stacking the low temperature buffer layer 102, the first semi-insulating GaN layer 103, the first channel layer 104 for electron movement and the first barrier layer 105 forming a 2-dimensional electron gas (2-DEG) layer on the sapphire substrate 101.

Thereafter, in an etching process for device integration, after patterning a first $SiO_2$ layer or a first $SiN_x$ layer 106 using a first mask, the first channel layer 104 and the first barrier layer 105 are etched. Then, the second semi-insulating GaN layer 107 is regrown on the first semi-insulating GaN layer 103 which is exposed. After two-dimensional surface growth is completed, the second channel layer 108 and the second barrier layer 109 are sequentially stacked. In this case, epitaxial properties of the semi-insulating GaN layer, the channel layer and the barrier layer, which are grown separately, are determined according to properties of devices to be integrated on the single substrate, and various types of devices may be integrated.

When the regrowth is completed, a second $SiO_2$ layer or a $SiN_x$ layer 110 is deposited, and then patterned oppositely to patterning using the first mask. Next, an etching process is performed up to the first $SiO_2$ layer or the $SiN_x$ layer 106, and the $SiO_2$ layer or the $SiN_x$ layer 106 which is exposed is removed.

Thereafter, an electrode layer for manufacturing an electronic device is formed. In this case, a Schottky electrode of a gate electrode is formed after forming ohmic contact of a source electrode and a drain electrode according to a design of a device pattern. The same type of or different types of GaN devices may be integrated on a single substrate based on the above-mentioned processes.

Figure 2:
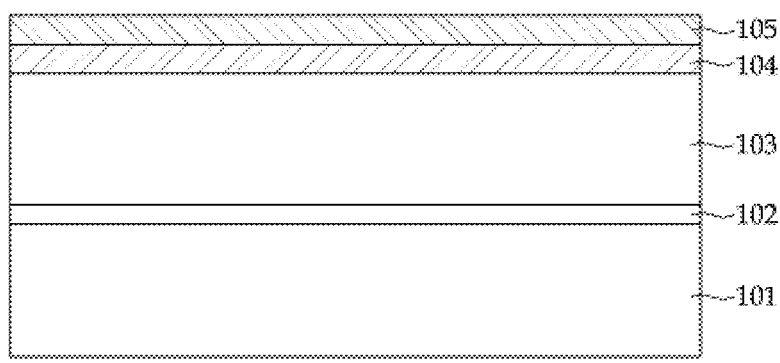
FIGS. 2 to 9 are a process flowchart illustrating a method for manufacturing a GaN electronic device according to the present disclosure.

FIG. 2 illustrates an epitaxial structure layer that is a basic structure of an electronic device using a GaN compound semiconductor. The epitaxial structure layer has a structure in which a sapphire substrate 101, a low temperature buffer layer 102, a first semi-insulating GaN layer 103, a first channel layer 104 and a first barrier layer 105 are sequentially stacked.

Describing steps of a manufacturing process of the epitaxial structure layer, the low temperature buffer layer 102 is first grown on the sapphire substrate 101. Thereafter, the first semi-insulating GaN layer 103 is grown on the low temperature buffer layer 102 to have a thickness of 2 to 3 μm so as to electrically insulate electronic devices and reduce leakage current. The first semi-insulating GaN layer 103 is grown to have an epitaxial structure which has high resistivity by changing a growth speed of high temperature GaN or controlling a growth mode of GaN.

Then, the first channel layer 104 is grown on the first semi-insulating GaN layer 103. The first channel layer 104 is a path through which electrons forming an current flow in an electronic device move between electrode layers, and in order for the first channel layer 104 to have high mobility, no impurities is doped or a minimum amount of dopant is used. The first channel layer 104 may be constituted by a ternary compound semiconductor including indium (In) or aluminum (Al) so as to increase an effect of interrupting leakage current and limiting current.

Then, the first barrier layer 105 is grown on the first channel layer 104. The first barrier layer 105 is mainly constituted by a ternary ($Al_xGa_{1-x}N$, $In_xGa_{1-x}N$, $In_xAl_{1-x}N$) or quaternary ($In_xAl_yGa_{1-x-y}N$) compound semiconductor. In this case, a composition ratio of elements and a thickness of the barrier layer are determined according to performance required for the GaN electronic device. In a high frequency electronic device, an $Al_xGa_{1-x}N$ barrier layer is mainly used, a composition ratio of Al is in the range of 20 to 40%, and a thickness thereof is in the range of 10 to 40 nm.

Figure 3:
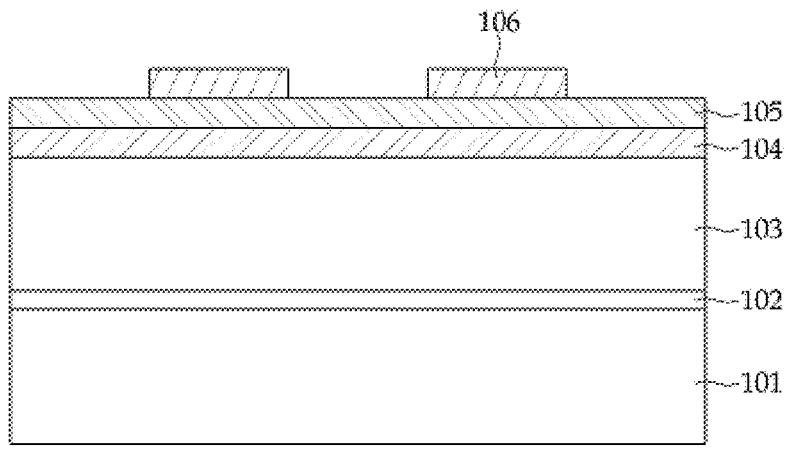
Figure 4:
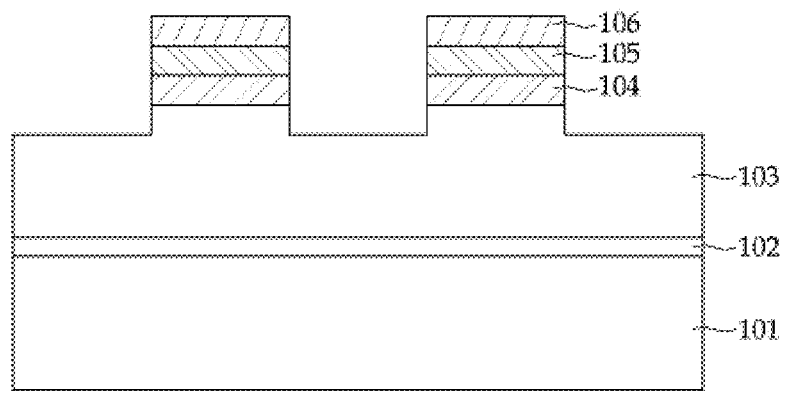

FIGS. 3 and 4 illustrate a step of forming a pattern and an etching step for regrowing semi-insulating GaN.

Referring to FIG. 3, a first dielectric layer 106 is used to form a pattern, and in this case, a thickness of the dielectric layer is in the range of 0.1 to 0.2 μm. $SiO_2$ or $SiN_x$ may be used for the first dielectric layer 106.

Referring to FIG. 4, an etching thickness is up to a depth at which the first semi-insulating GaN layer 103 is exposed and is generally in the range of 0.1 to 0.5 μm. FIG. 4 illustrates a first integrated structure.

Figure 5:
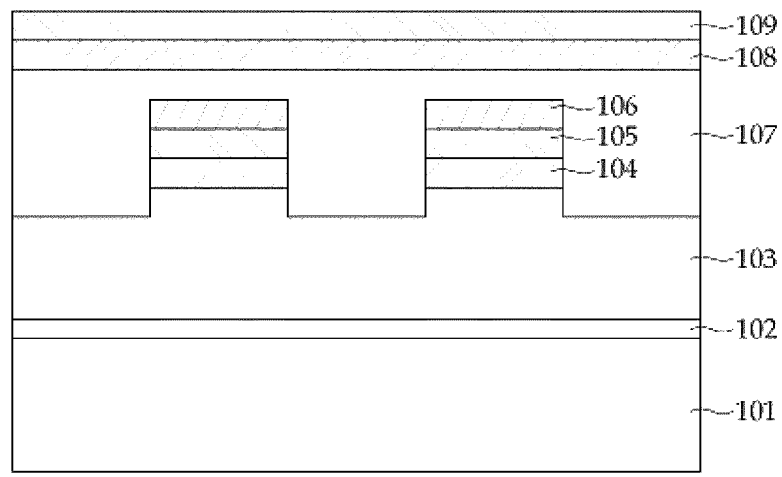

Referring to FIG. 5, the second semi-insulating GaN layer 107 is regrown on the surface of the etched first semi-insulating GaN layer [KCl2] 103, and the second channel layer 108 and the second barrier layer 109 are stacked in sequence. In this case, a total thickness of the grown second integrated structure needs to be within the range of 1 μm in consideration of pattern work. The detailed configuration of the second channel layer 108 and the second barrier layer 109 is similar to that of the first channel layer 104 and the first barrier layer 105 and needs to be designed depending on properties of the GaN electronic device.

FIGS. 6 to 9 simply illustrate steps of a manufacturing process of the GaN electronic device.

Figure 6:
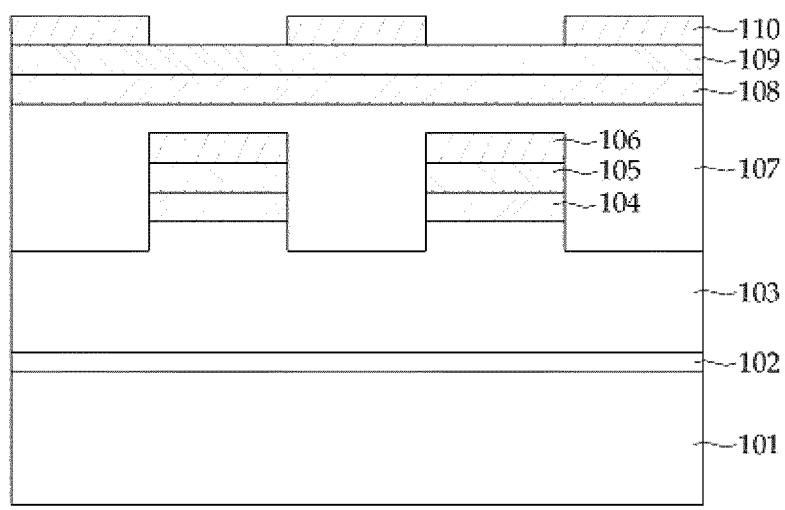

Referring to FIG. 6, a second dielectric layer 110 for an etching process is formed. In this case, the pattern formed is opposite to that of the first dielectric layer 106. $SiO_2$ or $SiN_x$ may be used for the second dielectric layer 110.

Figure 7:
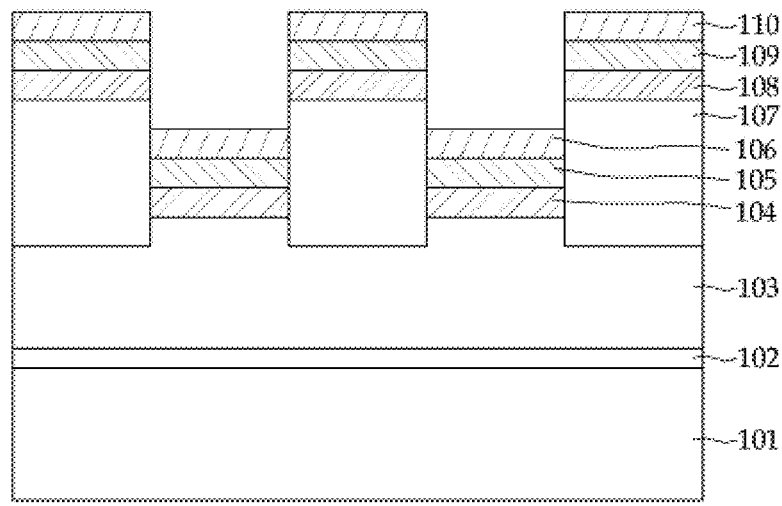
Figure 8:
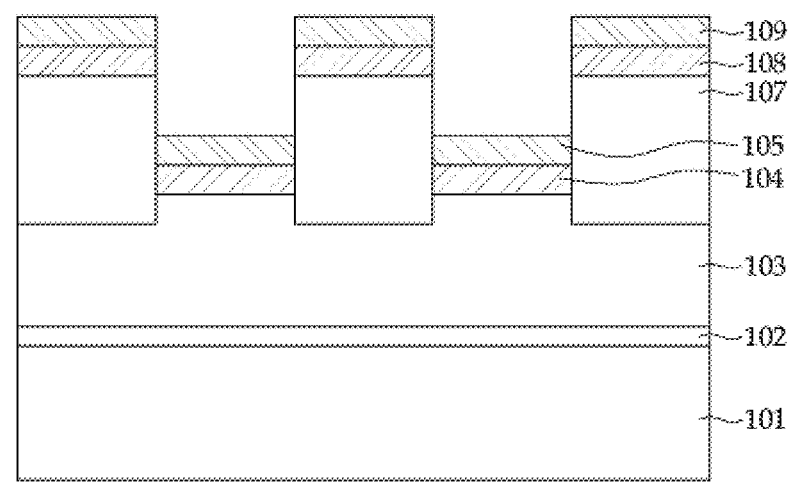
Figure 9:
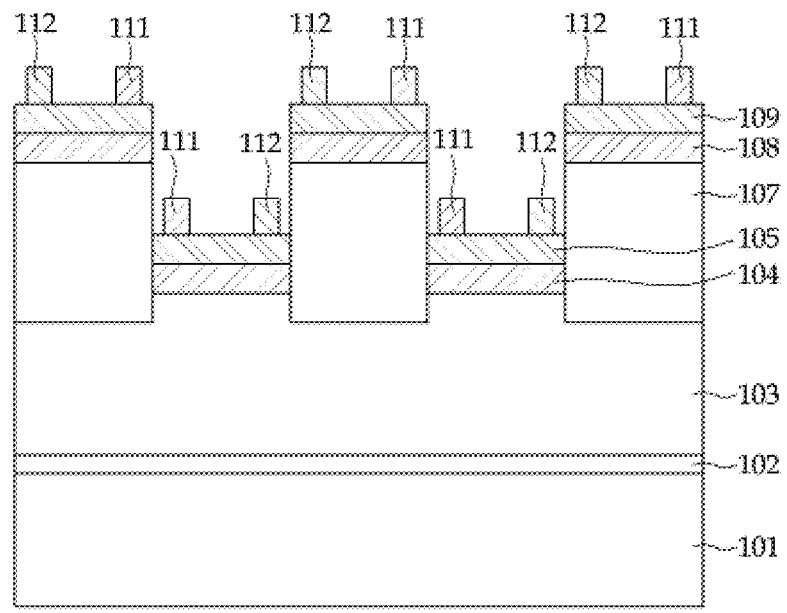

Referring to FIG. 7, an etching process is performed up to the first dielectric layer 106. Referring to FIG. 8, the first dielectric layer 106 and the second dielectric layer 110 used for forming the patterns are removed. Referring to FIG. 9, ohmic metal electrode layers 111 and 112 are stacked, and then Schottky metal electrode layers 113 are stacked according to a design structure of the GaN electronic device, thus manufacturing the GaN electronic device of FIG. 1.

FIGS. 10 to 13 illustrate various types of electronic device structures based on the structure of the GaN electronic device illustrated in FIG. 1.

Figure 10:
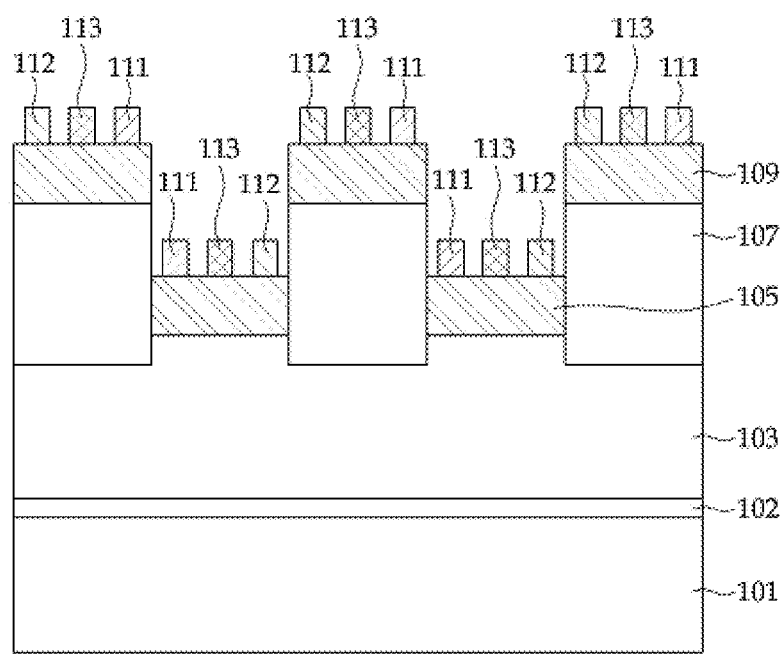
FIG. 10 is a cross-sectional view illustrating a structure of a GaN electronic device which includes only barrier layers by omitting a first channel layer and a second channel layer from the structure of the GaN electronic device of FIG. 1.

FIG. 10 illustrates a structure in which the first channel layer 104 and the second channel layer 108 are omitted. In the high frequency electronic device, a channel layer may be omitted depending on properties of the first semi-insulating GaN layer 103 and the second semi-insulating GaN layer 107.

Figure 11:
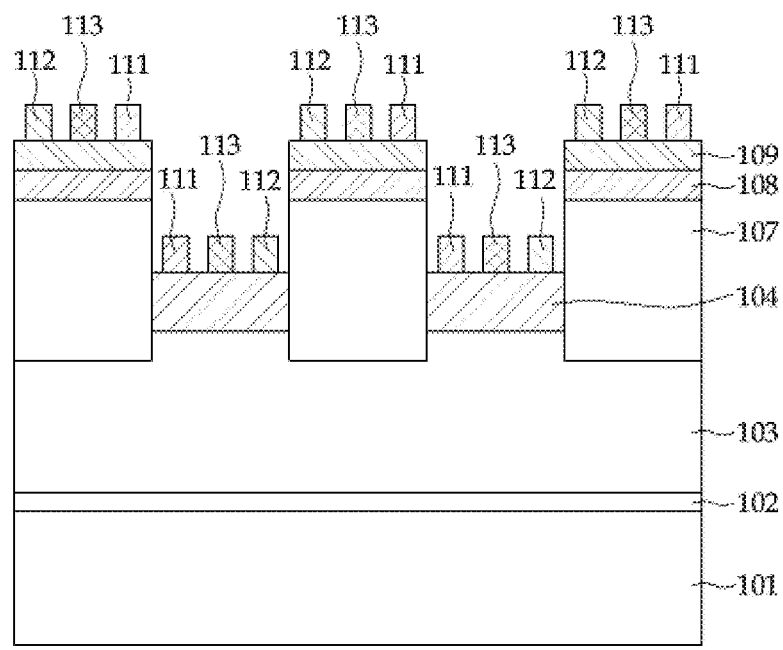
FIG. 11 is a cross-sectional view illustrating a structure of a GaN electronic device in which a first integrated structure in the structure of the GaN electronic device of FIG. 1 is constituted by only a channel layer, and a second integrated structure is constituted by a channel layer and a barrier layer.
Figure 12:
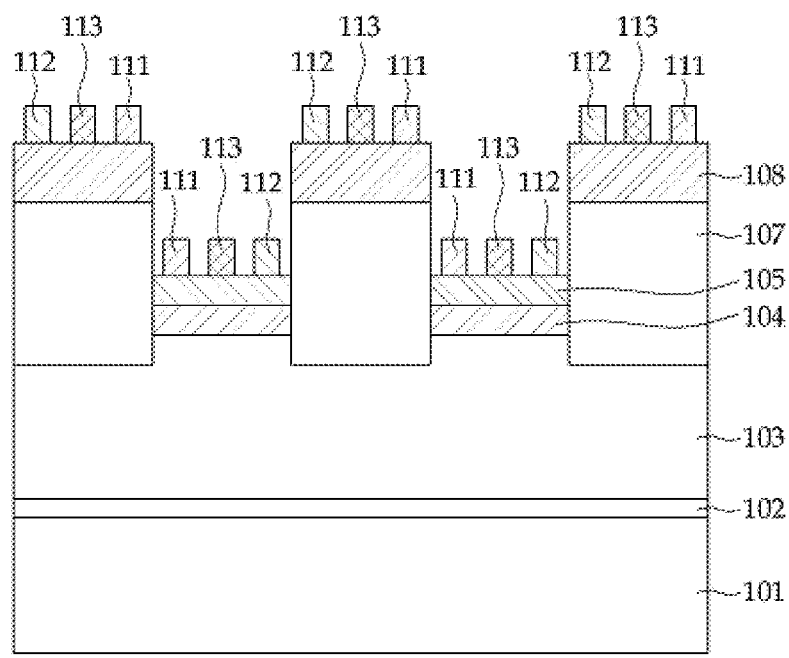
FIG. 12 is a cross-sectional view illustrating a structure of a GaN electronic device in which a first integrated structure in the structure of the GaN electronic device of FIG. 1 is constituted by a channel layer and a barrier layer, and a second integrated structure is constituted by only a channel layer.

FIG. 11 illustrates a structure in which the first barrier layer 105 is omitted, and FIG. 12 illustrates a structure in which the second barrier layer 109 is omitted.

Most of the electronic devices including a barrier layer have a high electron mobility transistor (HEMT) structure, and an electronic device without a barrier layer has a metal semiconductor field effect transistor (MESFET) structure having a high current driving property.

Figure 13:
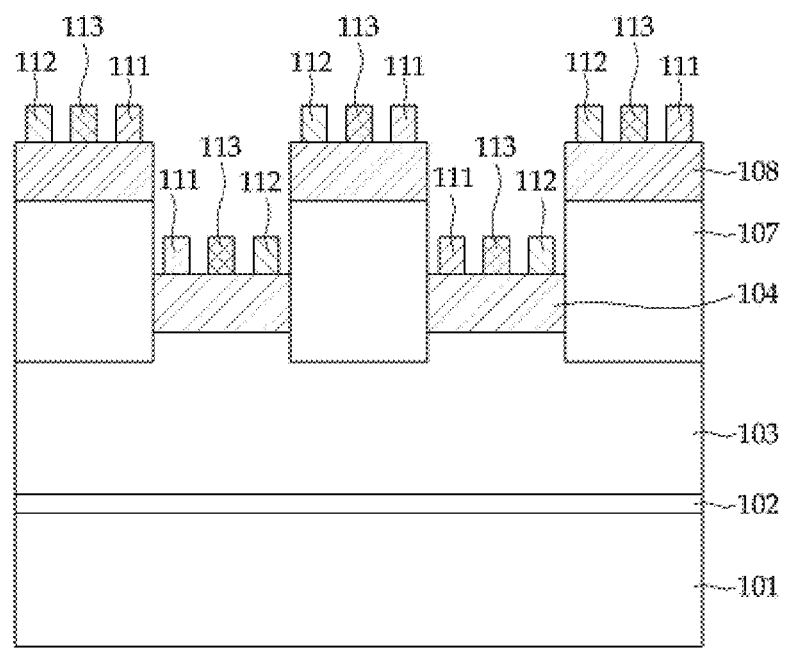
FIG. 13 is a cross-sectional view illustrating a structure of a GaN electronic device which includes only channel layers by omitting a first barrier layer and a second barrier layer from the structure of the GaN electronic device of FIG. 1.

FIG. 13 illustrates a structure including only channel layers by omitting both the first barrier layer and the second barrier layer. FIG. 13 illustrates a structure in which the same kind or different kinds of metal semiconductor field effect transistors are integrated according to properties of the channel layer.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method for manufacturing a nitride electronic device, comprising:
    forming an epitaxial structure in which a low temperature buffer layer, a first semi-insulating nitride layer, a first channel layer and a first barrier layer are sequentially stacked on a substrate;
    stacking a first dielectric layer for forming a pattern on the first barrier layer and partially etching the first barrier layer, the first channel layer and the first semi-insulating nitride layer;
    regrowing a second semi-insulating nitride layer on the etched first semi-insulating nitride layer;
    sequentially stacking a second channel layer and a second barrier layer on the second semi-insulating nitride layer;
    stacking a second dielectric layer for forming a pattern on the second barrier layer and etching the second barrier layer, the second channel layer and the second semi-insulating nitride layer; and
    removing the first and second dielectric layers and stacking metal electrode layers on the first and second barrier layers.

2. The method of claim 1, wherein the second dielectric layer is stacked in an opposite pattern to the pattern of the first dielectric pattern.

* * * * *